United States Patent
Hardacker et al.

(10) Patent No.: US 9,961,471 B2
(45) Date of Patent: May 1, 2018

(54) TECHNIQUES FOR PERSONALIZING AUDIO LEVELS

(71) Applicants: Sony Corporation, Tokyo (JP); Sony Electronics Inc., Parkridge, NJ (US)

(72) Inventors: Robert Hardacker, Escondido, CA (US); Steven Richman, San Diego, CA (US)

(73) Assignees: Sony Corporation, Tokyo (JP); Sony Electronics Inc., Parkridge, NJ (US)

( * ) Notice: Subject to any disclaimer, the term of this patent is extended or adjusted under 35 U.S.C. 154(b) by 221 days.

(21) Appl. No.: 14/562,178

(22) Filed: Dec. 5, 2014

(65) Prior Publication Data

US 2015/0086021 A1 Mar. 26, 2015

Related U.S. Application Data

(63) Continuation of application No. 12/136,733, filed on Jun. 10, 2008, now abandoned.

(51) Int. Cl.
H04R 5/00 (2006.01)
H04S 7/00 (2006.01)
H03G 3/30 (2006.01)

(52) U.S. Cl.
CPC ............ *H04S 7/303* (2013.01); *H03G 3/301* (2013.01); *H04R 2400/13* (2013.01); *H04S 7/302* (2013.01)

(58) Field of Classification Search
CPC ...... H04R 2400/13; H04R 29/00; H04R 1/22; H04R 31/00; H04S 7/302; H04S 7/303; H04S 2400/11; H04S 2420/01; H04S 7/30; H04J 3/1605; H04H 20/89; H04H 60/04
USPC .... 381/1-4, 92, 104-107, 86, 307, 119, 111, 381/17-22; 700/94; 704/270, 275, 200
See application file for complete search history.

(56) References Cited

U.S. PATENT DOCUMENTS

| | | | | |
|---|---|---|---|---|
| 4,251,688 A * | 2/1981 | Furner | ...................... | H04S 3/00 381/18 |
| 6,856,688 B2 * | 2/2005 | Cromer | ................... | H04S 7/301 381/303 |
| 7,577,260 B1 * | 8/2009 | Hooley | ............... | F41H 13/0081 381/307 |
| 7,970,153 B2 * | 6/2011 | Konagai | ................ | H04R 1/403 381/102 |
| 7,991,163 B2 * | 8/2011 | Loether | ................... | H04R 27/00 348/14.01 |
| 8,130,968 B2 * | 3/2012 | Tamaru | ................ | H04R 23/008 381/56 |
| 2003/0080875 A1 * | 5/2003 | Wathen | .............. | G07C 9/00182 340/12.22 |
| 2008/0044038 A1 * | 2/2008 | Houle | ..................... | H04S 1/002 381/97 |
| 2008/0232608 A1 * | 9/2008 | Ullmann | ................. | G01S 15/04 381/77 |

(Continued)

*Primary Examiner* — Lun-See Lao
(74) *Attorney, Agent, or Firm* — John L. Rogitz

(57) ABSTRACT

Techniques for personalizing audio levels, in accordance with embodiments of the present technology, provide different audio volumes to different locations in a room allowing for two of more users to enjoy the same audio content at different volumes. Differential level and delay compensation filtering based on a position of each of a plurality of speakers, the location of each user and the preferred relative audio volume of each user are utilized to produce different effective audio levels in localized regions of a room.

10 Claims, 2 Drawing Sheets

(56) References Cited

U.S. PATENT DOCUMENTS

2008/0285772 A1* 11/2008 Haulick ............. G01S 7/52003
    381/92
2009/0034745 A1* 2/2009 Mizuno ................. H04S 7/30
    381/1

* cited by examiner

TECHNIQUES FOR PERSONALIZING AUDIO LEVELS

BACKGROUND OF THE INVENTION

In the past, electronic audio and video systems included radio, television and record players that output audio m a single channel format. More recently, electronic audio and video systems have expanded to include video games, CD/DVD players, streaming audio (e.g., internet radio), MP3 devices, and the like. The audio and video systems now typically output audio in multi-channel formats such as stereo and surround sound. The use of multi-channel format audio generally enhances the user's listening and viewing experience by more closely replicating the original audio and/or enhancing a visual perception. For example, multi-channel audio may be used to output different instruments on different speakers to give the listener rise feeling of being in the middle of a band. In another example, in a movie the audio track of a plane may be faded from front to back to aid the perception of a plane flying out of the screen and past the viewer. However, users typically perceive the audio differently from one another.

SUMMARY OF THE INVENTION

Embodiments of the present technology are directed toward techniques for personalizing audio levels. In one embodiment, a method of personalizing audio levels includes determining the location and relative audio volume preference of each user. A localized audio volume may then be output proximate each user based upon the location and preferred relative audio volume of each user.

In another embodiment, a system for personalizing audio levels includes a plurality of speakers, a source of audio and a signal processor. The signal processor receives audio from the source and causes the plurality of speakers to output a localized audio volume proximate each user based upon a location and preferred relative audio volume of each user.

BRIEF DESCRIPTION OF THE DRAWINGS

Embodiments of the present invention are illustrated by way of example and not by way of limitation, in the figure of the accompanying drawings and in which like reference numerals refer to similar elements and in which.

DETAILED DESCRIPTION OF THE INVENTION

Reference will now be made in detail to the embodiment of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

It is appreciated that each sound source, such as a television, outputs sound within a range of continuous or discrete volumes. In addition, the effective sound level perceived by a user may differ from the output sound level of the sound source. Accordingly, the term "audio level" is used herein to refer to the output level of the sound source, the terms "audio volume" and "listening volume" are used herein to refer to the volume perceived by the user, and the term "audio level/volume" is used herein to refer to the relationship between the "audio level" and the "audio volume."

Figure 1:
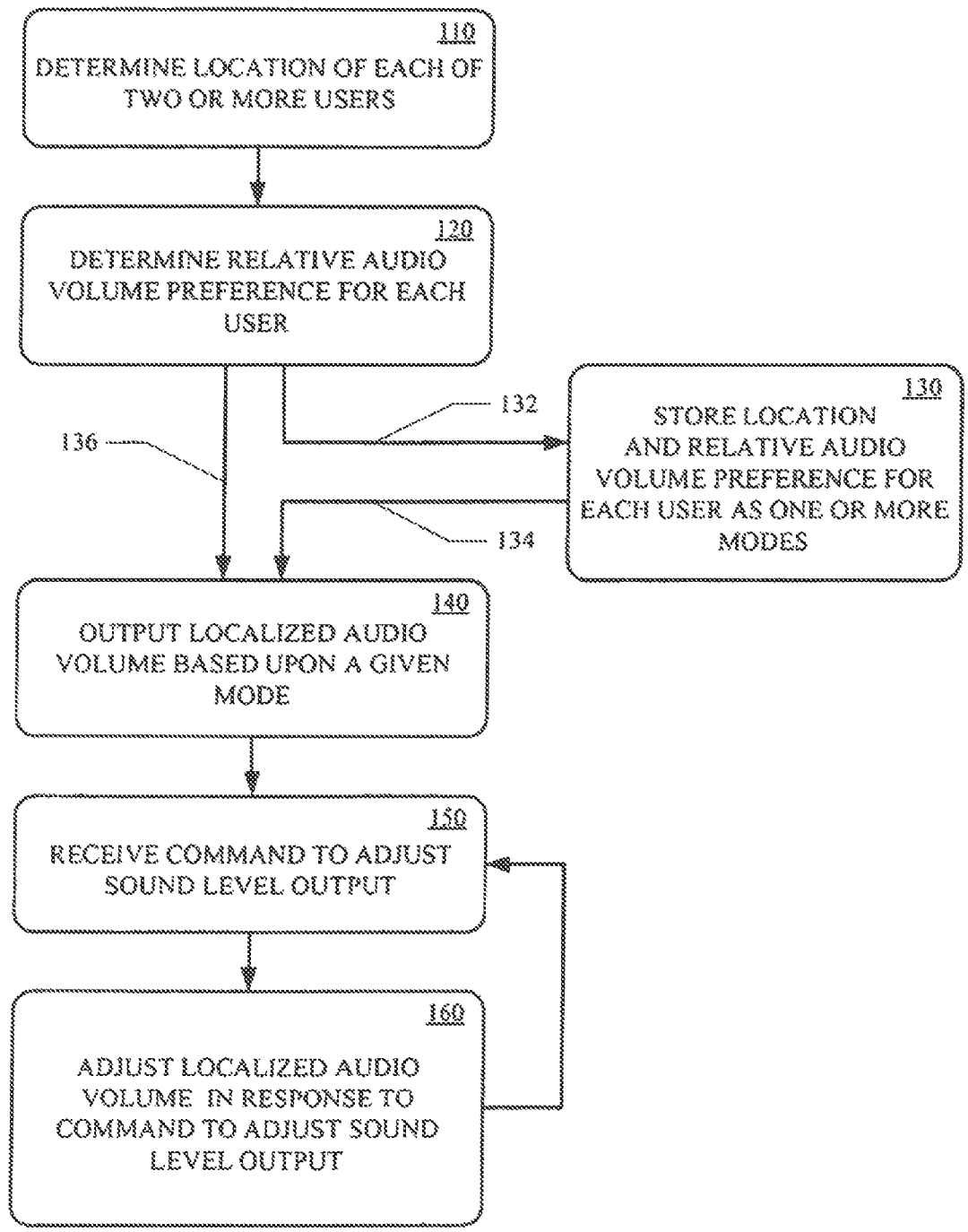
FIG. 1 shows a flow diagram of a method of personalizing audio levels, in accordance with one embodiment of the present technology.
Figure 2:
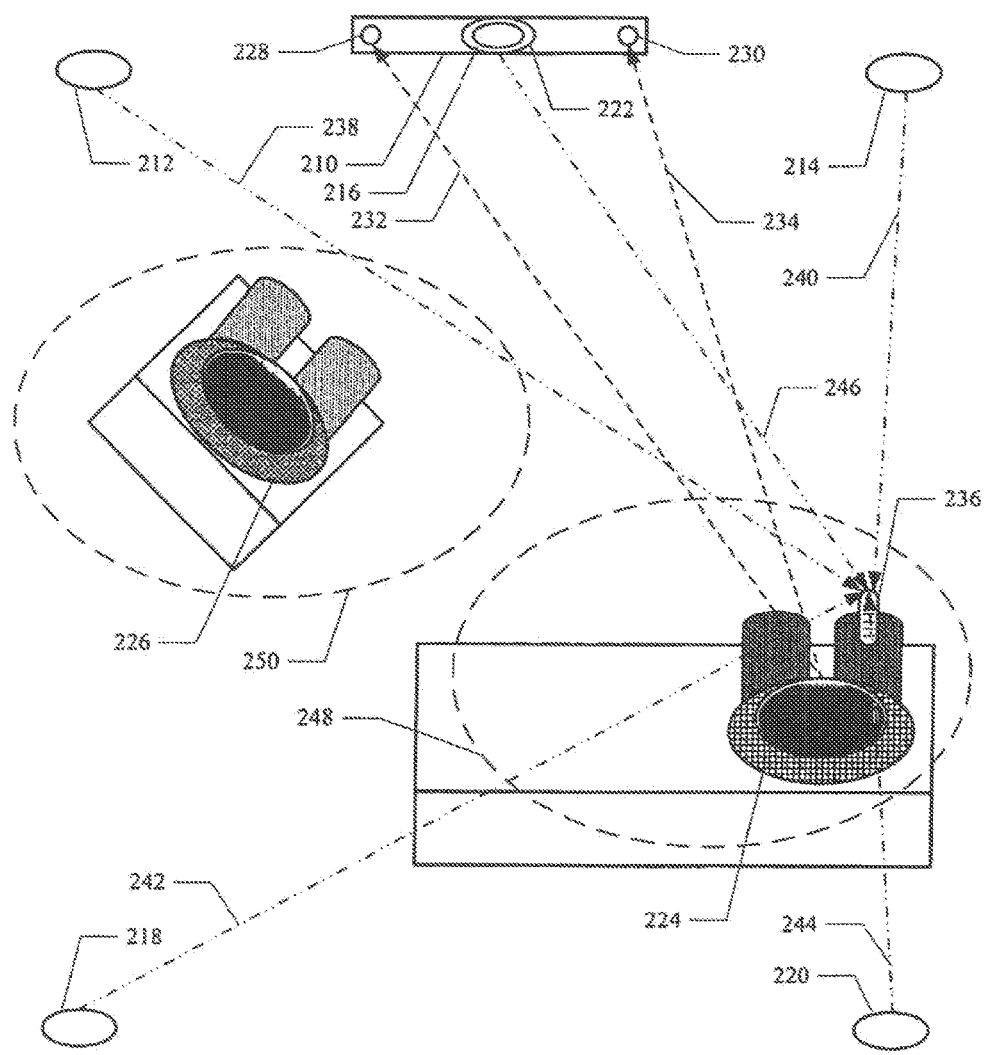
FIG. 2 shows a block diagram of an exemplary audio or multimedia environment for providing personalized audio levels.

Two or more users of a multimedia system often disagree on an appropriate listening volume. This results in a less than satisfactory experience for one or more users. Accordingly, there is a need for techniques for personalizing sound level/volume. Embodiments of the present technology personalize the sound level/volume by locating the users in a room, identifying the relative volume preferences of the users, and processing and delivering personalized audio levels to different users located at know locations. Embodiments may also adjust the processing and delivery of personalized audio levels in response to adjustments to the generic volume. Embodiments may also save and recall the location and relative volume preferences as one or more modes for use during other sessions. FIG. 1 shows a method of personalizing audio level/volume, in accordance with one embodiment of the present technology. The method of personalizing audio level/volume will be further described with reference to FIG. 2 which shows an exemplary audio or multimedia environment. It is appreciated that multimedia systems that output both audio and video are generally more commonly in use today, and therefore the following detailed description will refer to multimedia systems for convenience. However, it is to be appreciated that the present technology as described herein is equally applicable to systems that only output audio.

The exemplary multimedia environment includes source 210 and a plurality of speakers 212-222. The source may be a television, cable tuner, satellite tuner, game console, CD/DVD player, VCR, personal computer, and/or the like. In one implementation, the audio source 210 may output two channels of audio for output on two or more speakers. In another implementation, the audio source 210 may include four or more channels (e.g., 5.1 surround sound) for output on four or more speakers. For instance, the speakers may include a front left speaker 212, a right front speaker 214, a center speaker 216, a left surround speaker 218, a right surround speaker 220 and a subwoofer 222 for outputting a 5.1 surround sound format of audio.

The method of personalizing audio level/volume begins with determining the position of each of two or more users 224, 226, at 110. In one implementation, the multimedia system may include a pair of microphones 228, 230 located at known positions. The microphones 228, 230 receive sound from each user 224, 226. The sound received from each user may be used to triangulate the position of the corresponding user relative to the microphones 228, 230. For example, a microphone 228, 230 may be mounted on each side of a television 210. During a training or setup mode, each user 224, 226 may fee sequentially prompted to speak. The relative time difference between the sound 232, 234 received at each speaker 228, 230 may be used to determine the location of the corresponding user 224 that has been prompted to speak. A signal processing system may be used to determine the time delay between the sound from each corresponding user received at each microphone. The time delay may then be used along with the known position of each microphone 228, 230 to triangulate the position of the corresponding user 224. Additional microphones placed in additional locations may be used to determine the relative position in additional dimensions.

In another implementation, a remote controller 236 for the system may include a short range radio frequency (RF) transmitter and the television, set top box (STB) or the like may contain two or more antennas. The antennas are located at known positions. When each user 224, 226 possesses the remote controller 236, an RF signal is emitted from the transmitter in the remote controller 236 and received by the antennas. The RF signal received at the antennas is used by a signal processor to triangulate the position of the corresponding users. In a similar implementation, the remote controller 236 may include an infrared (IR) transmitter and two or more IR receivers may be positioned at known locations in the television, STB or the like.

In another implementation, a remote controller 236 for the system may include a microphone. When each user 224, 226 possesses the remote controller 236, sound (e.g., training tones) 238-246 emitted from speakers 212-220 at known fixed locations may be used to triangulate the location of the remote controller 236, and therefore the user 224 that posses the remote controller 236, relative to the speakers 212-220. The process is repeated for each user 224, 226. A signal processing system may be used to determine the time delay between the sound from each speaker 212-222 received at the microphone in the remote control 236. The time delay may then be used along with the known position of each speaker 212-222 to triangulate the position of the corresponding user 224, 226. Typically, the relative position of the users can be determined with sufficient accuracy by outputting sound sequentially on three speakers in diverse fixed locations (e.g., center, left rear and right rear speakers 216-220). In one implementation, the remote controller 236 may include logic for determining the time delay. Data indicating me time delay is may then be sent hack to a signal processor in the television, cable tuner, satellite tuner, game console, CD/DVD player, VCR, or personal computer which triangulates the position of the users from the time delay and the know location of the speakers. In another implementation, a signal processor in the remote controller 236 may determine the time delay and triangulate the position of the users and return data to the television, cable tuner, satellite tuner, game console, CD/DVD player, VCR, or personal computer indicating the determined position of the users. The data may be returned from the remote controller across an RF link or IR link of the remote control. Alternatively, the data may be returned via an NFC link, a USB link, memory stick sneaker netted hack to the television, cable tuner, satellite tuner, game console, CD/DVD player, VCR, personal computer or the like, or by another similar communication technique.

In another implementation, a remote controller 236 for the system may include a transmitter and emits a tone or sound during a particular mode or during activation of one or more buttons on the remote control. The tone or sound may be in the audible range (e.g., 20 Hz-20 KHz), or may be outside the audible range (e.g., 20-48 KHz) such as an ultrasonic tone or sound. The tone or sound is received by a plurality of receivers (e.g., microphones) in fixed locations that are contained in or coupled to the television, set top box (STB) or the like. The sound or tone received from the remote control when possessed by each user may be used by a signal processor in the television, set top box, or the like, to triangulate the position of the corresponding user relative to the receivers.

In yet another implementation, a graphical user interface (GUI) is displayed on the television 210. A user selects a relative shape of the room, and a region corresponding to the location in the room of each user 224, 226. The location may be selected from a grid overlaid over the relative shape of the room displayed on the GUI.

At 120, the relative audio volume preference for each user 224, 226 is determined. When determining the relative audio volume preference for each user it may be best that the audio volume is substantially constant across ail the locations at which the users may be located. A logic unit may determine one or more volume levels preferred by a first user and corresponding volume level preferred by one or more additional users for each volume level preference determined for the first user. The logic unit then determines the relative audio volume preference from the difference between each user's one or more corresponding preferred audio levels.

In one implementation, each user 224 is sequentially prompted to adjust the audio level of the system to the audio volume preferred by the user. The user 224 may use the remote control 236 to select a single preferred audio volume or verbal commands picked up by the microphones 228, 230. The difference in the audio levels selected by each user 224, 226 is used to determine the relative audio volume preference for each user. In one implementation, the relative audio volume preference may be fixed for all audio levels of an audio source. In such an implementation, the audio volume difference between users is fixed for all audio levels. In another implementation, a response curve for the relative audio volume preference of each user may be determined. In such an implementation, the users may be iteratively queried to select a preferred effective audio volume for each audio level. In addition, each user may specify a minimum and/or maximum effective audio volume. The data concerning the preferred effective audio volume for each audio level, minimum and/or maximum effective audio volume is used to determine a response curve. The response curve indicates the preferred relative audio volume of each user.

In one implementation, the location and relative audio volume preference for each user 224, 226 is determined during a training or setup mode. The position and relative audio volume preference for each user may then be stored 132 as a set of mode information, at 130. The location and relative audio volume preference for each user determined during processes 110 and 120 may be stored 132 for use 134 in setting the localized volume and adjusting the localized volume in response to commands to adjust the sound level. In one implementation, the location and relative sound volume preference may be determined and stored 132 for the current session. In another implementation, the location and relative sound volume preference may be stored 132 and recalled 134 for the current and subsequent session to reduce the setup time during each session. For example, a currently determined location and relative sound volume preferences may be stored 132 as one of a plurality of modes. During other subsequent sessions, a given mode may be selected 134 for use during the session. This can be particularly useful as viewer habits often are characterized by a given group of users located in the same spots in the room from one session to another. For instance, when a husband and wife are watching television, the husband may most times sit in a first location and the wife may most times sit in a second location. When a husband, wife and a child are watching television, the husband may again sit in the first location, the child may most times sit in the second location and the wife may most times sit in a third location. Therefore, a first mode may include the location and relative audio volume preferences for the husband and wife in the first and second locations respectively. A second mode may include the location and relative sound volume preferences for the husband, child and wife in the first, second and third locations respectively. Any number of additional modes may be created and stored 132 for various combinations of users. Alternatively, the location and relative audio volume preference for each user determined at 120 may be used directly 136 to output localized audio volume at 140.

The audio is output based on the location and preferred relative audio volume of each user, at 140. The volume of the audio at the location corresponding to each user (e.g., localized audio volume 248, 250) is output at a relative audio volume preferred by the user. The audio source 110 includes a signal processing unit that applies differential level and delay compensation filtering to produce psychoacoustical perception of the audio by one or more users 224, 226. Psychoacoustics are utilized to produce given audio volumes in localized regions 248, 250 of a room by applying differential level and delay compensation to the conventional audio output. The differential level and delay compensation filtering is based on the position of the speakers 212-222, the location of one or more users 224, 226, and the relative audio volume preference of the corresponding user. The signal processing unit may be implemented by a microprocessor or a dedicated digital signal processor (DSP). As a result, different relative audio levels for two or more locations are produced. For example, a first location 248 may be +6 dB louder than a second location 250, regardless of the volume level from the television. In other words, the audio level in a localized region 248 around the first user 224 may be at an effective level of 7 and the effective audio level in a localized region 250 around the second user 226 may be at art effective level of 5, when the audio level of the audio source is set to 7.

Depending upon the response curves of the individual listeners, the relative audio volume at the first and second positions may also vary as the audio level of the audio source increases or decreases. For example, the relative difference between the first and second positions 248, 250 may be 6 dB when the audio level output by the television is at level 4, and might be +8 dB at a audio level of 7.

At 150, a command to adjust the audio level is received. Typically, a user 224 may use the remote control 236 to issue a command to adjust the audio level up or down using one or more appropriate buttons on the remote controller 236. The remote controller 236 issues an appropriate command to the appropriate device to adjust the audio level in response to activation of an appropriate button by the user 224. In another implementation, a microphone on the remote controller 236, television or the like and a digital signal processor (DSP) implementing voice recognition may be used to receive audible commands from the user to adjust the levels. In yet another implementation, the user may input a command to adjust the audio level using one or more hand gestures or any other means for adjusting the audio level. At 160, the localized audio volume proximate each user is adjusted based on the location and preferred relative audio volume of each user in response to the command to adjust the audio level. For example, one of the users 224 may use the remote controller 236 to adjust the audio level from 7 to 9. The audio output is adjusted so that the audio volume in the localized region 248 around the first user 224 is increased to an effective level of 9 and the effective level in a localized region 250 around the second user 226 is increased to an effective level of 7. The process at 150 and 160 may be repeated to increase or decrease the localized audio volumes in response to each corresponding command.

Embodiments of the present technology advantageously provide different audio volumes to different locations in a room allowing for two or more users to enjoy the same audio content at different volumes. Psychoacoustics are utilized to produce different effective audio levels in localized regions of a room based on the location and relative sound level preferences of the current set of users.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. A method of personalizing audio levels comprising:
   determining a location of at least a first user relative to a speaker system adapted to output demanded sound at least in part by triangulating radio frequency (RF) or infrared (IR) signals from a remote control;
   determining a location of at least a second user relative to the speaker system adapted to output demanded sound;
   receiving first input indicating a preferred volume of the first user;
   receiving second input indicating a preferred volume of the second user, the first volume being different from the second volume;
   using the speaker system, outputting a localized audio volume proximate to the first user based upon the first input indicating the preferred volume of the first user and the location of the first user; and
   using the speaker system, outputting a localized audio volume proximate to the second user based upon the second input indicating the preferred volume of the second user and the location of the second user, the localized audio volume proximate the second user being different from the localized audio output proximate the first user.

2. The method according to claim 1, wherein outputting a localized audio volume proximate the first user comprises psychoacoustic modulating audio to produce an audio volume proximate the first user based upon the location of the first user.

3. The method according to claim 1, wherein outputting a localized audio volume proximate the first user comprises applying differential level and delay compensation filtering to audio based on a position of each of a plurality of audio speakers in the speaker system and the location of the first user.

4. The method according to claim 1, further comprising:
   receiving a command to adjust audio level;

adjusting the localized audio volume proximate the first user based on the location of the first user in response to the command to adjust the audio level; and adjusting the localized audio volume proximate the second user based on the location of the second user in response to the command to adjust audio level.

5. The method according to claim 4, wherein the command comprises an audio command received from a user.

6. The method according to claim 1, wherein determining the location of each of first and second users comprises:
  receiving sound from each respective user;
  determining time delay between the sound received from each respective user at a plurality of microphones; and
  triangulating a position of each respective user from the time delay between sound received from each respective user at the plurality of microphones.

7. The method according to claim 1, wherein determining the location of each of first and second users comprises
  outputting sound from each of a plurality of speakers;
  determining time delay between the sound received from each speaker at a microphone proximate each respective user; and
  triangulating a position of each respective user from the time delay between sound received from each speaker at the microphone.

8. The method according to claim 1, wherein determining the preferred volume of each respective user comprises:
  determining a preferred audio level of each respective user; and
  determining a difference between the preferred audio level of each respective user.

9. The method according to claim 1, wherein determining the preferred volume of each respective user comprises:
  determining a preferred audio level for each respective user for each of a plurality of audio levels; and
  determining a difference between the preferred audio level of each respective user for each of the plurality of audio levels.

10. The method according to claim 1, further comprising storing the location and preferred volume of each respective user.

* * * * *